United States Patent
Lin et al.

(10) Patent No.: US 10,872,667 B2
(45) Date of Patent: Dec. 22, 2020

(54) DECODING METHOD, MEMORY CONTROLLING CIRCUIT UNIT AND MEMORY STORAGE DEVICE

(71) Applicant: PHISON ELECTRONICS CORP., Miaoli (TW)

(72) Inventors: Wei Lin, Taipei (TW); Yu-Cheng Hsu, Yilan County (TW); Szu-Wei Chen, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 74 days.

(21) Appl. No.: 16/248,812

(22) Filed: Jan. 16, 2019

(65) Prior Publication Data

US 2020/0185032 A1   Jun. 11, 2020

(30) Foreign Application Priority Data

Dec. 6, 2018   (TW) ............................ 107143921 A

(51) Int. Cl.
*G06F 3/06* (2006.01)
*G11C 16/08* (2006.01)
(Continued)

(52) U.S. Cl.
CPC ............ *G11C 16/08* (2013.01); *G06F 3/0604* (2013.01); *G06F 3/0659* (2013.01); *G06F 3/0679* (2013.01); *G11C 11/5671* (2013.01); *G11C 16/0483* (2013.01); *G11C 16/10* (2013.01); *G11C 16/14* (2013.01); *G11C 16/26* (2013.01)

(58) Field of Classification Search
CPC ..... G11C 16/08; G11C 16/10; G11C 11/5628; G11C 11/5642; G11C 16/0483; G11C 16/26; G06F 3/0604; G06F 3/0659; G06F 3/0679
See application file for complete search history.

(56) References Cited

U.S. PATENT DOCUMENTS 7,791,510 B2 * 9/2010 Maeda ............... H03M 7/40
                                                341/67
9,780,809 B2 * 10/2017 Tuers ................ H03M 13/45
(Continued)

OTHER PUBLICATIONS

T. Nakayama et al., "A new decoding scheme and erase sequence for 5 V only sector erasable flash memory," 1992 Symposium on VLSI Circuits Digest of Technical Papers, Seattle, WA, USA, 1992, pp. 22-23, doi: 10.1109/VLSIC.1992.229255.*
J. Wang et al., "Enhanced Precision Through Multiple Reads for LDPC Decoding in Flash Memories," in IEEE Journal on Selected Areas in Communications, vol. 32, No. 5, pp. 880-891, May 2014, doi: 10.1109/JSAC.2014.140508.*
(Continued)

*Primary Examiner* — Pierre Miche Bataille
(74) *Attorney, Agent, or Firm* — JCIPRNET

(57) ABSTRACT

A decoding method, a memory controlling circuit unit, and a memory storage device are provided. The method includes: reading a first physical programming unit by using a first read voltage to obtain first data; determining whether a first ratio of a first quantity of a first bit value and a second quantity of a second bit value in the first data is greater than a threshold; when the first ratio is not greater than the threshold, performing a decoding operation according to the first data to generate first decoded data and outputting the first decoded data; and when the first ratio is greater than the threshold, not performing the decoding operation according to the first data.

13 Claims, 11 Drawing Sheets

(51) Int. Cl.
  *G11C 16/26* (2006.01)
  *G11C 11/56* (2006.01)
  *G11C 16/14* (2006.01)
  *G11C 16/10* (2006.01)
  *G11C 16/04* (2006.01)

(56) References Cited

U.S. PATENT DOCUMENTS

| | | | |
|---|---|---|---|
| 2013/0326296 A1* | 12/2013 | Choi | G11C 29/50004 |
| | | | 714/721 |
| 2016/0098317 A1* | 4/2016 | Alhussien | G11C 27/005 |
| | | | 714/764 |
| 2016/0133324 A1 | 5/2016 | Alrod et al. | |
| 2016/0322990 A1* | 11/2016 | Tuers | H03M 13/2909 |
| 2017/0206130 A1* | 7/2017 | Hsiao | H03M 13/6325 |
| 2018/0159560 A1* | 6/2018 | Sharon | G06F 3/067 |

OTHER PUBLICATIONS

Authors et. al.: (Disclosed Anonymously), "Soft decoding of hard and soft bits read from a flash memory", An IP.com Prior Art Database Technical Disclosure, The IP.Com Journal, Mar. 4, 2007.*
Soft Decoding of Hard and Soft Bits Read From a Flash Memory, IP.com Prior Art Database Technical Disclosure, Mar. 2007.*
S. Benedetto and G. Montorsi, "A new decoding algorithm for geometrically uniform trellis codes," in IEEE Transactions on Communications, vol. 44, No. 5, pp. 581-590, May 1996, doi: 10.1109/26.494302.*
D. V. Sarwate and Zhiyuan Yan, "Modified Euclidean algorithms for decoding Reed-Solomon codes," 2009 IEEE International Symposium on Information Theory, Seoul, 2009, pp. 1398-1402, doi: 10.1109/ISIT.2009.5205901.*
"Office Action of Taiwan Counterpart Application," dated Sep. 17, 2019, p. 1-p. 12.

* cited by examiner

| Lower physical programming unit | Middle physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

DECODING METHOD, MEMORY CONTROLLING CIRCUIT UNIT AND MEMORY STORAGE DEVICE

CROSS-REFERENCE TO RELATED APPLICATION

This application claims the priority benefit of Taiwan application serial no. 107143921, filed on Dec. 6, 2018. The entirety of the above-mentioned patent application is hereby incorporated by reference herein and made a part of this specification.

BACKGROUND

Technical Field

The invention relates to a decoding method, a memory controlling circuit unit and a memory storage device.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, when using a read voltage to read data from the rewritable non-volatile memory module, a memory management circuit can perform a decoding operation on the read data in order to obtain the desired read data. However, when the decoding operation fails, the memory management circuit will perform a retry-read mechanism to re-obtain another read voltage, and use said another read voltage for a reading operation to re-obtain the read data for the decoding operation. The memory management circuit performs the same decoding operation according to re-obtained verification bits to obtain another decoded data composed of a plurality of decoded bits. The retry-read mechanism for re-obtaining the read voltage may be repeatedly performed until the number of times exceeds a preset number of times.

In particular, in the retry-read mechanism described above, normally, the memory management circuit re-obtains said another read voltage for the reading operation only when a data is read but the decoding operation performed according to that data fails. In other words, before said another read voltage is obtained, it is usually necessary to perform two steps of "reading" and "decoding", and said another read voltage is obtained for the read operation only when the decoding operation fails. However, the more number of times the read voltage is re-obtained, the more time it will consume. Therefore, how to reduce an execution time for the retry-read mechanism is one of the issues to be addressed by persons skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a decoding method, a memory controlling circuit unit and a memory storage device, which are capable of reducing the execution time for the retry-read mechanism and accordingly improve a data reading efficiency.

The invention proposes a decoding method for a rewritable non-volatile memory module. The rewritable non-volatile memory module has a plurality of physical erasing units. Each physical erasing unit among the physical erasing units has a plurality of physical programming units. The decoding method includes: obtaining first data by applying a first read voltage among a plurality of read voltages on a first physical programming unit of a first physical erasing unit among the plurality of physical erasing units; determining, in the first data, whether a first ratio of a first quantity of a first bit value and a second quantity of a second bit value is greater than a threshold; performing a decoding operation according to the first data to generate first decoded data and outputting the first decoded data if the first ratio is not greater than the threshold; and not performing the decoding operation according to the first data if the first ratio is greater than the threshold.

The invention proposes a memory controlling circuit unit for a rewritable non-volatile memory module. The rewritable non-volatile memory module has a plurality of physical erasing units. Each physical erasing unit among the physical erasing units has a plurality of physical programming units. The memory control circuit unit includes a host interface, a memory interface and a memory management circuit. The host interface is configured to couple to a host system. The memory interface is configured to couple to a rewritable non-volatile memory module. The memory management circuit is coupled to the host interface and the memory interface. The memory management circuit is configured to perform the following operations: obtaining first data by applying a first read voltage among a plurality of read voltages on a first physical programming unit of a first physical erasing unit among the plurality of physical erasing units; determining, in the first data, whether a first ratio of a first quantity of a first bit value and a second quantity of a second bit value is greater than a threshold; performing a decoding operation according to the first data to generate first decoded data and outputting the first decoded data if the first ratio is not greater than the threshold; and not performing the decoding operation according to the first data if the first ratio is greater than the threshold.

The invention proposes a memory storage device. The memory storage device includes a connection interface unit, a rewritable non-volatile memory module and a memory controlling circuit unit. The connection interface unit is configured to couple to a host system. The rewritable non-volatile memory module has a plurality of physical erasing units, and each physical erasing unit among the physical erasing units includes a plurality of physical programming units. The memory controlling circuit unit is coupled to the connection interface unit and the rewritable non-volatile memory module. The memory controlling circuit unit is configured to perform the following operations: obtaining first data by applying a first read voltage among a plurality of read voltages on a first physical programming unit of a first physical erasing unit among the plurality of physical erasing units; determining, in the first data, whether a first ratio of a first quantity of a first bit value and a second quantity of a second bit value is greater than a threshold; performing a decoding operation according to the first data to generate first decoded data and outputting the first decoded data if the first ratio is not greater than the threshold; and not performing the decoding operation according to the first data if the first ratio is greater than the threshold.

The invention proposes a decoding method for a rewritable non-volatile memory module. The rewritable non-volatile memory module has a plurality of physical erasing units. Each physical erasing unit among the physical erasing units has a plurality of physical programming units. The decoding method includes: obtaining first data by applying a first read voltage among a plurality of read voltages on a first physical programming unit of a first physical erasing unit among the plurality of physical erasing units; determining, in the first data, whether a first ratio of a first quantity of a first bit value and a second quantity of a second bit value is greater than a threshold; performing a decoding operation according to the first data to generate first decoded data and outputting the first decoded data if the first ratio is not greater than the threshold; obtaining second data by applying a second read voltage among the plurality of read voltages on the first physical programming unit if the first ratio is greater than the threshold; determining, in the second data, whether a second ratio of a third quantity of the first bit value and a fourth quantity of the second bit value is greater than the threshold; performing the decoding operation according to the second data to generate second decoded data and outputting the second decoded data if the second ratio is not greater than the threshold; and not performing the decoding operation according to the second data if the second ratio is greater than the threshold.

Based on the above, after a data record is read, the decoding method, the memory control circuit unit and the memory storage device of the invention can quickly determine whether or not the decoding operation on the data record is likely to fail without decoding the data record. Also, if the decoding operation may fail, another read voltage may be re-obtained directly for the reading operation. In this way, the execution time for the retry-read mechanism may be reduced and the data reading efficiency may be improved accordingly.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 10 is a schematic diagram illustrating management of physical erasing units according to an exemplary embodiment.

DESCRIPTION OF THE EMBODIMENTS

Figure 1:
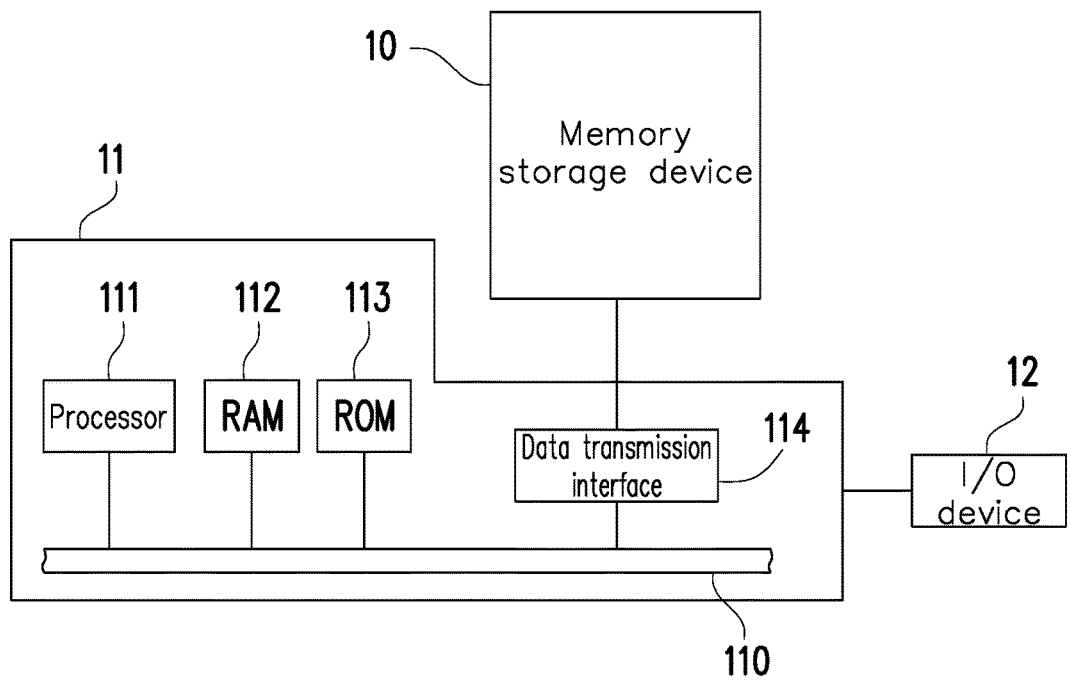
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
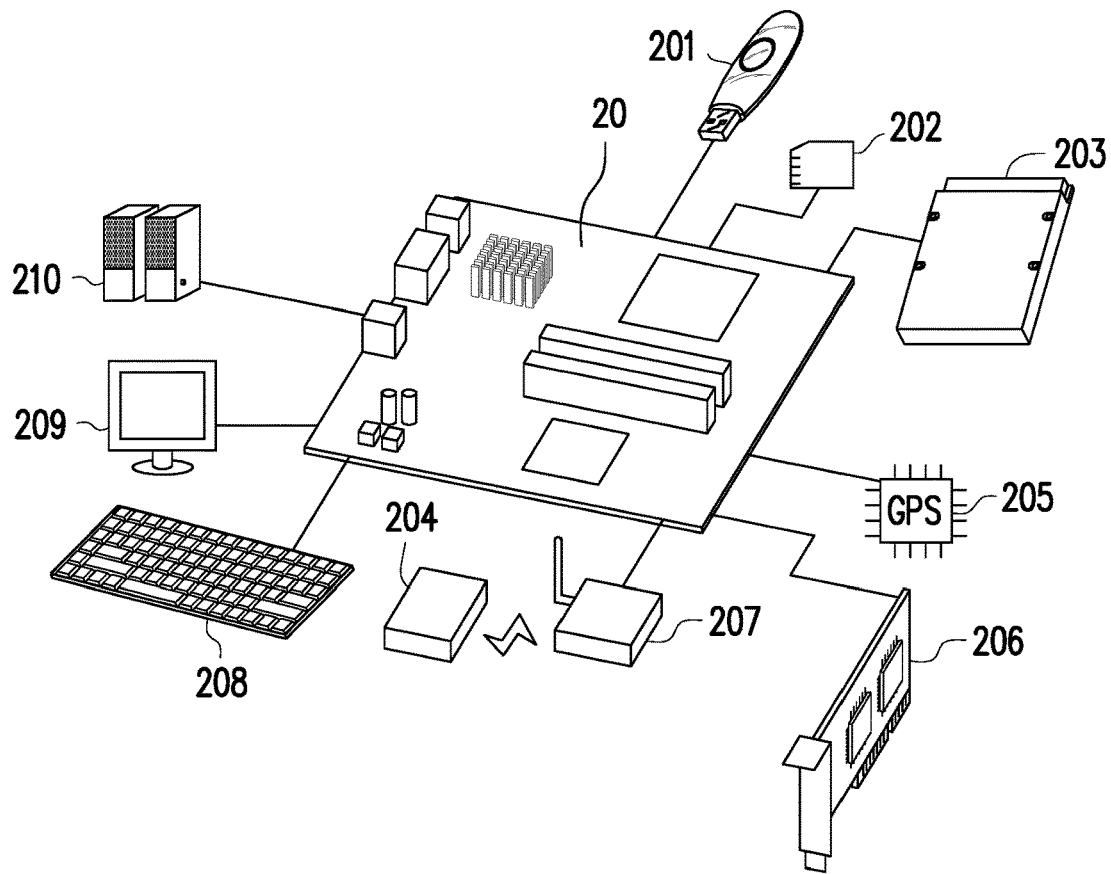
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In this exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 510 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
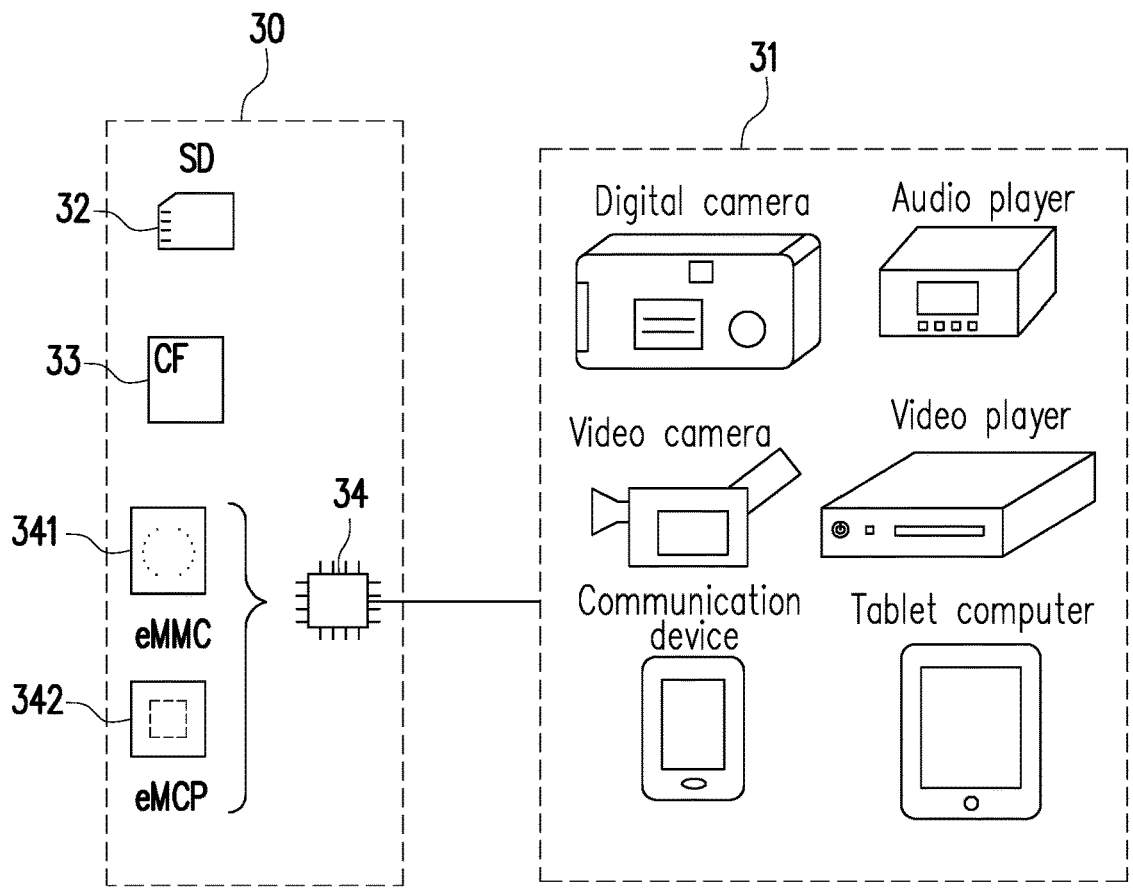
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the disclosure. Referring to FIG. 3, in another exemplary embodiment, a host system 31 may also be a system including a digital camera, a video camera, a communication device, an audio player, a video player or a tablet computer, whereas a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
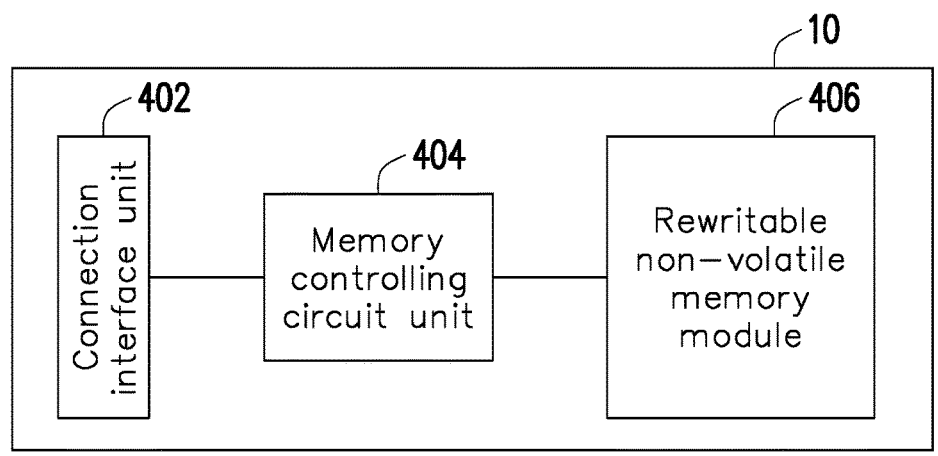
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory controlling circuit unit 404 and a rewritable non-volatile memory module 406.

In this exemplary embodiment, the connection interface unit 402 is compatible with a SATA (Serial Advanced Technology Attachment) standard. Nevertheless, it should be understood that the invention is not limited in this regard. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory controlling circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in an array. The memory cell array is described below using a two-dimensional array. However, it should be noted that, the following exemplary embodiment is simply an example of the memory cell array. In other exemplary embodiments, a disposition method of the memory cell array may be adjusted to satisfy actual requirements.

Figure 5:
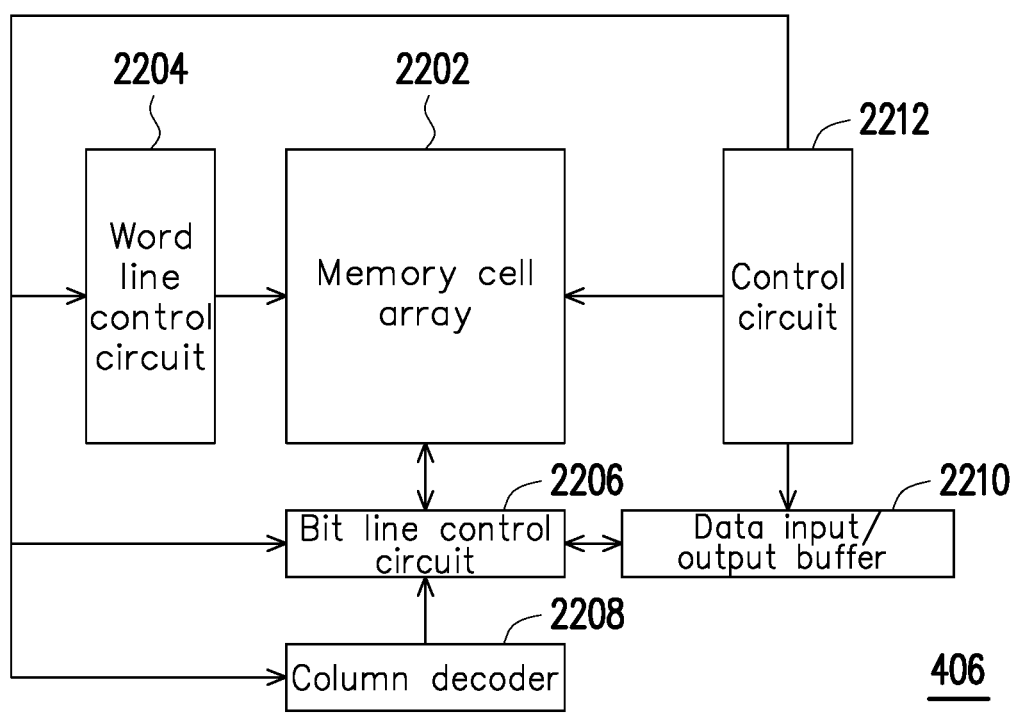
FIG. 5 is a schematic block diagram illustrating a rewritable non-volatile memory module according to an exemplary embodiment.
Figure 6:
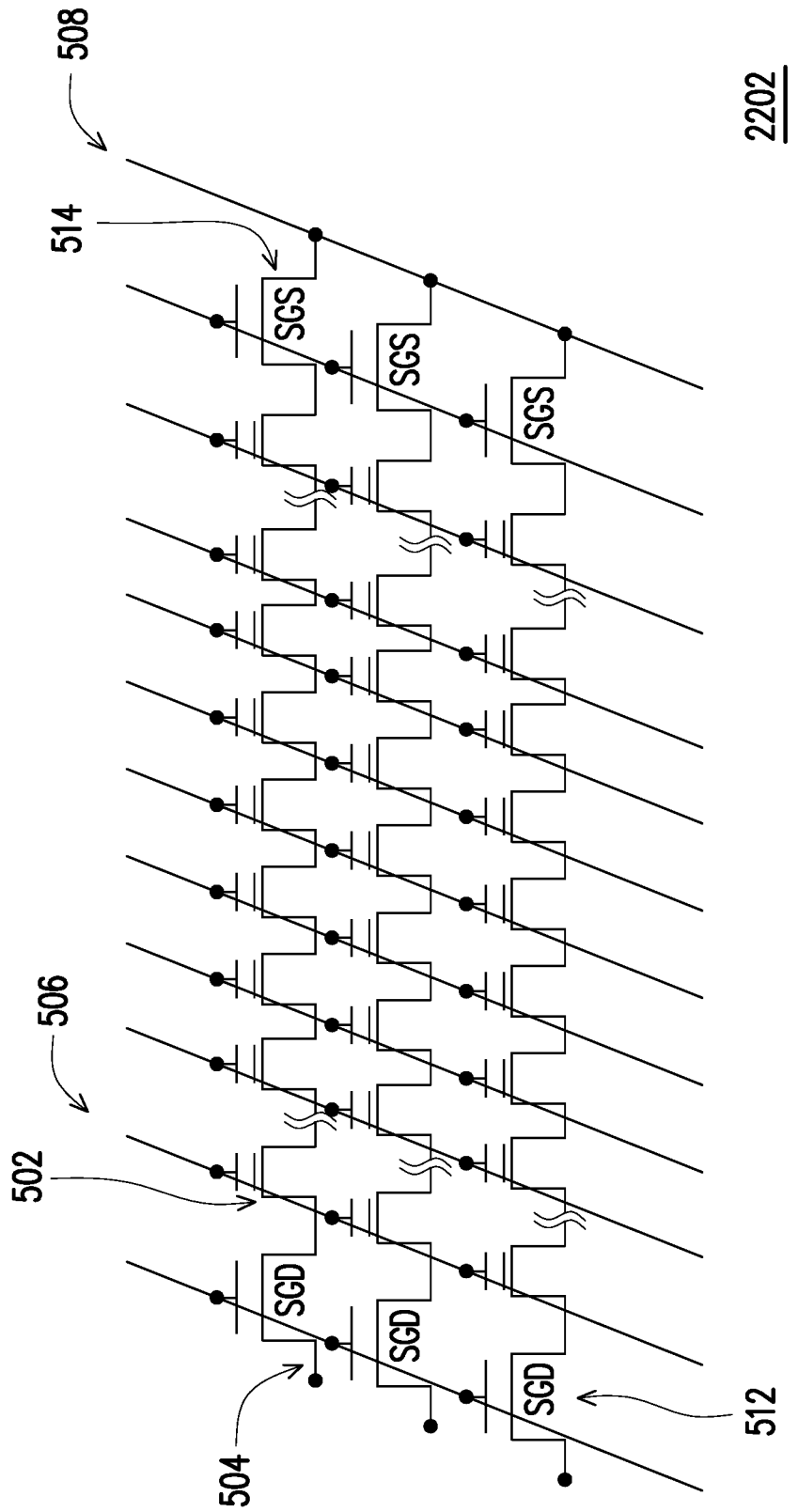
FIG. 6 is a schematic diagram illustrating a memory cell array according to an exemplary embodiment.

FIG. 5 is a schematic block diagram illustrating a rewritable non-volatile memory module according to an exemplary embodiment. FIG. 6 is a schematic diagram illustrating a memory cell array according to an exemplary embodiment.

Referring to FIG. 5 and FIG. 6 together, the rewritable non-volatile memory module 406 includes a memory cell array 2202, a word line control circuit 2204, a bit line control circuit 2206, a column decoder 2208, a data input/output buffer 2210 and a control circuit 2212.

In this exemplary embodiment, the memory cell array 2202 may include a plurality of memory cells 502 used to store data, a plurality of select gate drain (SGD) transistors 512, a plurality of select gate source (SGS) transistors 514, as well as a plurality of bit lines 504, a plurality of word lines 506, a common source line 508 connected to the memory cells (as shown in FIG. 6). The memory cell 502 is disposed at intersections of the bit lines 504 and the word lines 506 in a matrix manner (or in a 3D stacking manner). When a write command or a read command is received from the memory controlling circuit unit 404, the control circuit 2212 controls the word line control circuit 2204, the bit line control circuit 2206, the column decoder 2208, the data input-output buffer 2210 to write the data into the memory cell array 2202 or read the data from the memory cell array 2202, wherein the word line control circuit 2204 is configured to control voltages applied to the word lines 506, the bit line control circuit 2206 is configured to control voltages applied to the bit lines 504, the column decoder 2208 is configured to select the corresponding bit line according to a row address in a command, and the data input/output buffer 2210 is configured to temporarily store the data.

The memory cell in the rewritable non-volatile memory module 406 may store multiple bits by changing a threshold voltage of one memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell". Each of the memory cells in the memory cell array 2022 has a plurality of storage statuses depended on changes in the threshold voltage. A read voltage can be used to determine what storage state the memory cell belongs to, so as to obtain the bit stored by the memory cell.

Figure 7:
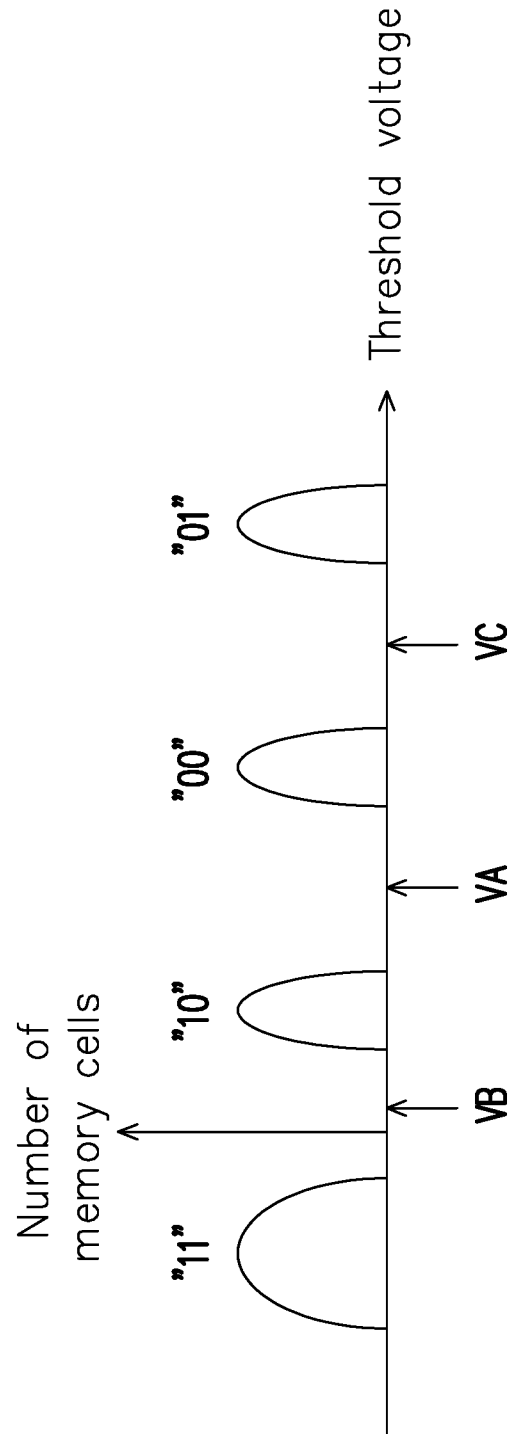
FIG. 7 is a histogram of a gate voltage corresponding to write data stored in the memory cell array according to an exemplary embodiment.

FIG. 7 is a histogram of a gate voltage corresponding to write data stored in the memory cell array according to an exemplary embodiment.

Referring to FIG. 7 that takes the MLC NAND flash memory for example, in which each of the memory cells has four storage states depending on different threshold voltages, and the storage states represent bits "11", "10", "00" and "01", respectively. In other words, each of the storage states includes a least significant bit (LSB) and a most significant bit (MSB). In this exemplary embodiment, among the storage states (i.e., "11", "10", "00" and "01"), a first bit counted from the left is the LSB, and a second bit counted from the left is the MSB. Accordingly, in this exemplary embodiment, each of the memory cells can store two bits. It should be understood that, the storage statuses corresponding to the threshold voltage as illustrated in the FIG. 7 are merely an example. In another exemplary embodiment of the invention, the threshold voltages and the corresponding storage states may also have an arrangement of "11", "10", "01" and "00" that is arranged according to the threshold voltage from small to large, or have other arrangements. In addition, in another exemplary embodiment, it can also be defined that the first bit counted from the left is the MSB, and the second bit counted from the left is the LSB.

In an exemplary embodiment where one memory cell is capable of storing multiple bits (e.g., the MLC or TLC flash memory module), the physical programming units belonging to the same word line may at least be classified into a lower physical programming unit and an upper physical programming unit. For instance, in the MLC NAND flash memory module, a least significant bit (LSB) of a memory cell belongs to the lower physical programming unit, and a most significant bit (MSB) of one memory cell belongs to the upper physical programming unit. In an exemplary embodiment, the lower physical programming unit is also known as a fast page, and the upper physical programming unit is also known as a slow page. In addition, in the TLC NAND flash memory module, a least significant bit (LSB) of a memory cell belongs to the lower physical programming unit, a center significant bit (CSB) of that memory cell belongs to a middle physical programming unit, and a most significant bit (MSB) of that memory cell belongs to the upper physical programming unit.

Figure 8:
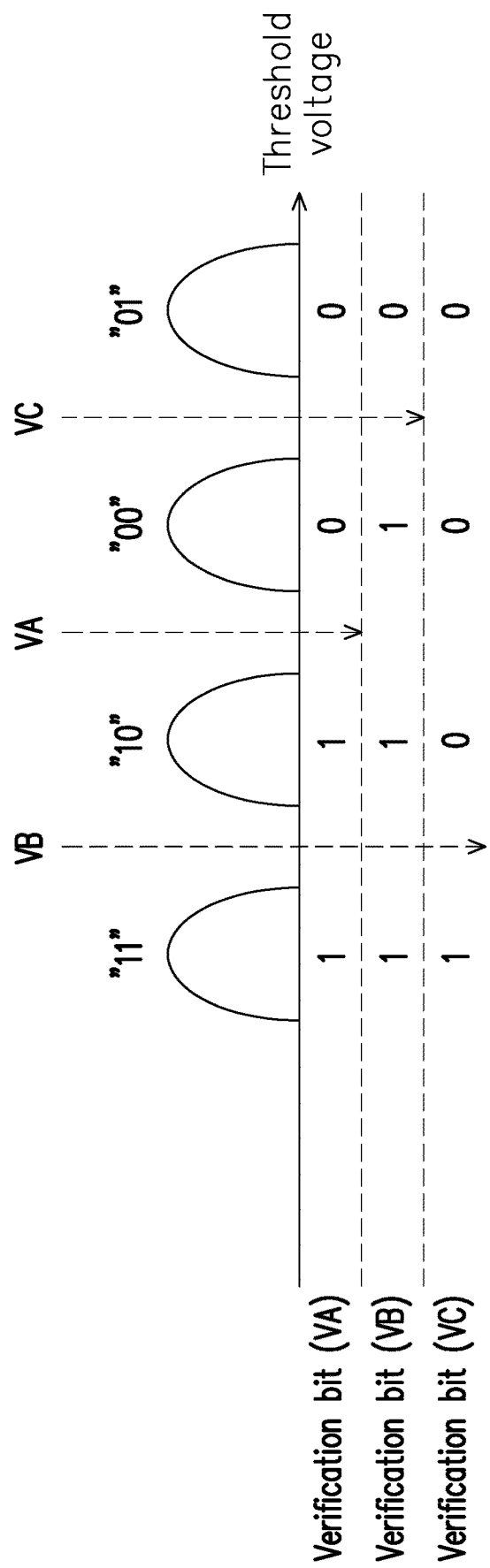
FIG. 8 illustrates a schematic diagram of reading data from a memory cell according to an exemplary embodiment.

FIG. 8 illustrates a schematic diagram for reading data from a memory cell according to an exemplary embodiment, in which a MLC NAND flash memory is used as an example.

Referring to FIG. 8, in a reading operation for the memory cells of the memory cell array 2202, read voltages VA to VC are applied to the control gate, and data stored in the memory cells are identified according whether the channel of the memory cell is turned on. A verification bit (VA) is configured to indicate whether the channel of the memory cell is turned on when a read voltage VA is applied; a verification bit (VC) is configured to indicate whether the channel of the memory cell is turned on when a read voltage VC is applied; and a verification bit (VB) is configured to indicate whether the channel of the memory cell is turned on when a read voltage VB is applied. Here, it is assumed that the corresponding memory cell channel is turned on when the verification bit is "1", and the corresponding memory cell channel is not turned on when the verification bit is "0". As shown in FIG. 8, the storage state of the memory cell may be determined according to the verification bits (VA) to (VC) so the bits stored can be obtained.

Figure 9:
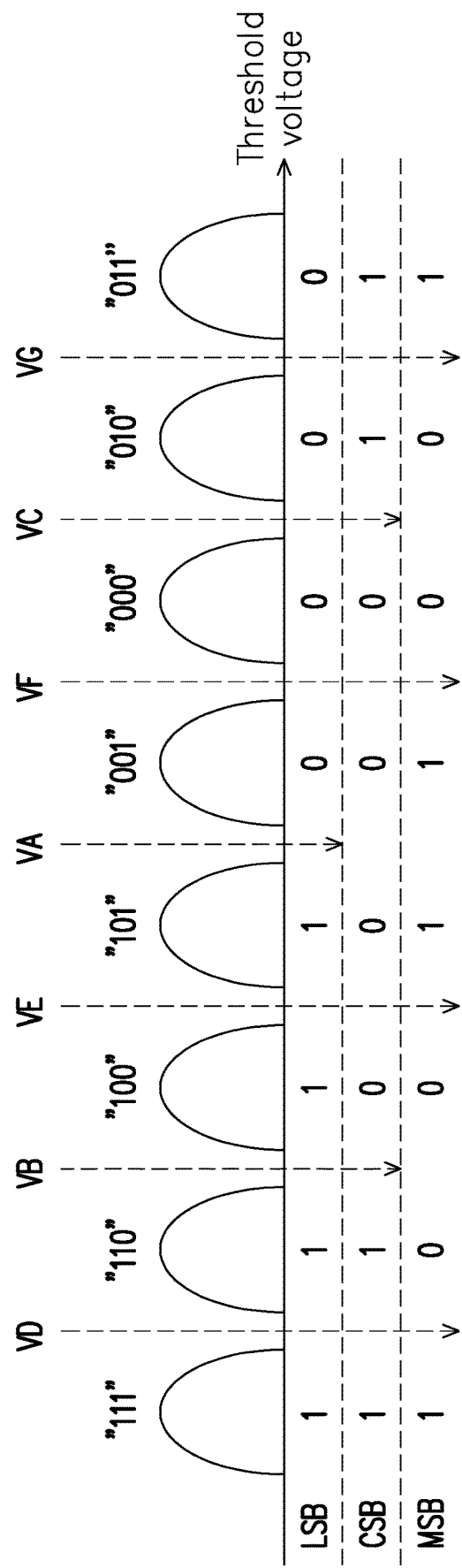
FIG. 9 illustrates a schematic diagram of reading data from a memory cell array according to another exemplary embodiment.

FIG. 9 illustrates a schematic diagram of reading data from a memory cell array according to another exemplary embodiment.

With reference to FIG. 9 that takes the TLC NAND flash memory for example, each of the storage states includes a first bit counted from the left being the least significant bit (LSB), a second bit counted from the left being a center significant bit (CSB) and a third bit counted from the left being the most significant bit (MSB). In this embodiment, the memory cell includes eight storage states depending on different threshold voltages (i.e., "111", "110", "100", "101", "001", "000", "010" and "011"). The bits stored in the memory cell may be identified by applying the read voltages VA to VC to the control gate.

Here, it should be noted that, an arranging sequence of the eight storage states in FIG. 9 may be decided based on manufacturer designs instead of being limited by the arranging sequence of this embodiment.

In addition, the memory cells of the rewritable non-volatile memory module 406 constitute a plurality of physical programming units, and the physical programming units constitute a plurality of physical erasing units. Specifically, the memory cells on the same word line in FIG. 6 constitute one or more of the physical programming units. For example, if the rewritable non-volatile memory module 406 is the MLC NAND flash memory module, the memory cells on intersections between the same word line and the bit lines constitute 2 physical programming units, i.e., the upper physical programming unit and the lower physical programming unit. In this case, one upper physical programming unit and one lower physical programming unit may be collectively referred to as a physical programming unit group. In particular, if data to be read is located in a lower physical programming unit of a physical programming unit group, the read voltage VA in FIG. 8 may be adopted to identify each bit value in the lower physical programming unit. If data to be read is located in an upper physical programming unit of a physical programming unit group, the read voltage VB and the read voltage VC in FIG. 8 may be adopted to identify each bit value in the upper physical programming unit.

Alternatively, if the rewritable non-volatile memory module 406 is the TLC NAND flash memory module, the memory cells on intersections between the same word line and the bit lines constitute 3 physical programming units, i.e., the upper physical programming unit, the middle physical programming unit and the lower physical programming unit. In this case, one upper physical programming unit, one middle physical programming unit and one lower physical programming unit may be collectively referred to as a physical programming unit group. In particular, if data to be read is located in a lower physical programming unit of a physical programming unit group, the read voltage VA in FIG. 9 may be adopted to identify each bit value in the lower physical programming unit. If data to be read is located in a middle physical programming unit of a physical programming unit group, the read voltage VB and the read voltage VC in FIG. 9 may be adopted to identify each bit value in the middle physical programming unit. If data to be read is located in an upper physical programming unit of a physical programming unit group, the read voltage VD, the read voltage VE and the read voltage VF and the read voltage VG in FIG. 9 may be adopted to identify each bit value in the upper physical programming unit.

In this exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., an error correcting code). In this exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

FIG. 10 is a schematic diagram illustrating management of physical erasing units according to an exemplary embodiment.

With reference to FIG. 10, in this exemplary embodiment, it is assumed that one physical erasing unit is constituted by a plurality of physical programming unit groups. Each of the physical programming unit groups includes the lower physical programming unit, the center physical programming unit and the upper physical programming unit constituted by multiple memory cells arranged on the same word line. For example, in the physical erasing unit, the 0-th physical programming unit belonging to the lower physical programming unit, the 1-st physical programming unit belonging to the center physical erasing unit and the 2-nd physical programming unit belonging to the upper physical programming unit are regarded as one physical programming unit group. Similarly, the 3-rd, the 4-th, and the 5-th physical programming units are regarded as one physical programming unit group, and by analogy, the other physical programming units are also grouped into multiple physical programming unit groups by the same method.

Figure 11:
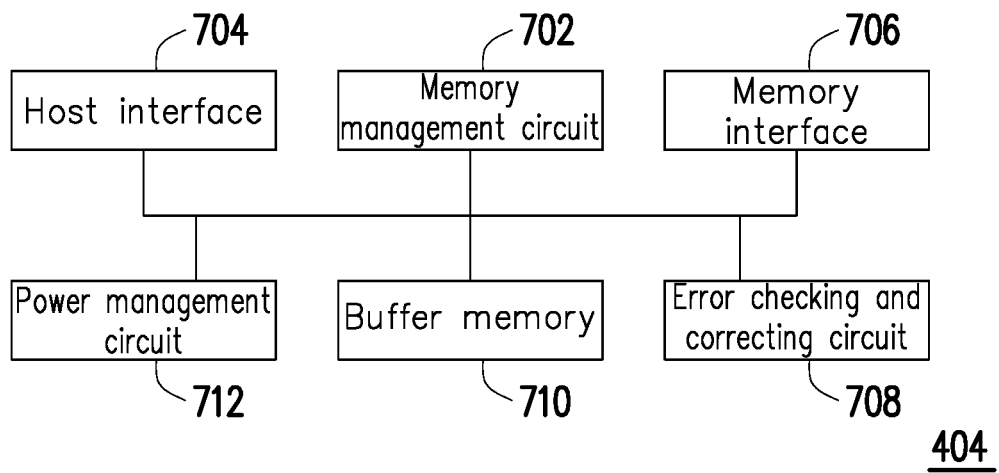
FIG. 11 is a schematic block diagram illustrating a memory controlling circuit unit according to an exemplary embodiment of the invention.

FIG. 11 is a schematic block diagram illustrating a memory controlling circuit unit according to an exemplary embodiment of the invention.

Referring to FIG. 11, the memory controlling circuit unit 404 includes a memory management circuit 702, a host interface 704, a memory interface 706 and an error check and correction circuit 708.

The memory management circuit 702 is configured to control overall operations of the memory controlling circuit unit 404. Specifically, the memory management circuit 702 has a plurality of control commands. When the memory storage device 10 operates, the control commands are executed to perform various operations such as data writing, data reading and data erasing. Hereinafter, description regarding operations of the memory management circuit 702 or any circuit element in the memory controlling circuit unit 404 is equivalent to description regarding operations of the memory controlling circuit unit 404.

In this exemplary embodiment, the control commands of the memory management circuit 702 are implemented in form of firmware. For instance, the memory management circuit 702 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 702 may also be stored as program codes in a specific area (for example, the system area in a memory exclusively used for storing system data) of the rewritable non-volatile memory module 406. In addition, the memory management circuit 702 has a microprocessor unit (not illustrated), a ROM (not illustrated) and a RAM (not illustrated). In particular, the ROM has a boot code, which is executed by the microprocessor unit to load the control commands stored in the rewritable non-volatile memory module 406 to the RAM of the memory management circuit 702 when the memory controlling circuit unit 404 is enabled. Then, the control commands are executed by the microprocessor unit to perform operations, such as writing, reading or erasing data.

Further, in another exemplary embodiment, the control commands of the memory management circuit 702 may also be implemented in a form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 702 may further give command sequence of other types to the rewritable non-volatile memory module 406 for instructing to perform the corresponding operations.

The host interface 704 is coupled to the memory management circuit 702 and configured to receive and identify commands and data sent from the host system 11. In other words, the commands and data transmitted by the host system 11 are transmitted to the memory management circuit 702 via the host interface 704. In this exemplary embodiment, the host interface 704 is compatible with the SATA standard. Nevertheless, it should be understood that the invention is not limited in this regard. The host interface 704 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable by the rewritable non-volatile memory module 406 via the memory interface 706. Specifically, if the memory management circuit 702 intends to access the rewritable non-volatile memory module 406, the memory interface 706 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 702 and transmitted to the rewritable non-volatile memory module 406 through the memory interface 706, for example. The command sequences may include one or more signals, or data transmitted in the bus. The signals or the data may include command codes and program codes. For example, information such as identification codes and memory addresses are included in the read command sequence.

The error check and correction circuit 708 is coupled to the memory management circuit 702 and configured to perform an error checking and correcting operation to ensure integrity of data. Specifically, when the memory management circuit 702 receives the writing command from the host system 11, the error check and correction circuit 708 generates an error correcting code (ECC) or an error detecting code (EDC) for data corresponding to the writing command, and the memory management circuit 702 writes data and the ECC or the EDC corresponding to the writing command to the rewritable non-volatile memory module 406. Then, when the memory management circuit 702 reads the data from the rewritable non-volatile memory module 406, the corresponding ECC and/or the EDC are also read, and the error check and correction circuit 708 performs the error checking and correcting operation on the read data based on the ECC and/or the EDC.

In an exemplary embodiment, the memory controlling circuit unit 404 further includes a buffer memory 710 and a power management circuit 712.

The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

In this exemplary embodiment, the error check and correction circuit 708 can perform a single-frame encoding for the data stored in the same physical programming unit and can also perform a multi-frame encoding for data stored in multiple physical programming units. Each of the single-frame encoding and the multi-frame encoding may adopt encoding algorithms including at least one of a LDPC (low density parity code), a BCH code, a convolutional code or a turbo code. Alternatively, in another exemplary embodiment, the multi-frame encoding may also include a RS codes (Reed-solomon codes) algorithm or an XOR (exclusive OR) algorithm. Further, in another exemplary embodiment, more of other encoding algorithms not listed above may also be adopted, which are omitted herein. According to the adopted encoding algorithm, the error check and correction circuit 708 can encode the data to be protected, so as to generate the corresponding ECC and/or the EDC. For clear description, the ECC and/or the EDC generated by encoding are collectively referred to as encoded data.

It is noted that in the following description, some terms may be replaced with corresponding abbreviations for ease of reading (see Table 1).

TABLE 1

| rewritable non-volatile memory module | RNVM module |
|---|---|
| physical erasing unit | PEU |
| physical programming unit | PPU |
| memory management circuit | MMC |

Figure 12:
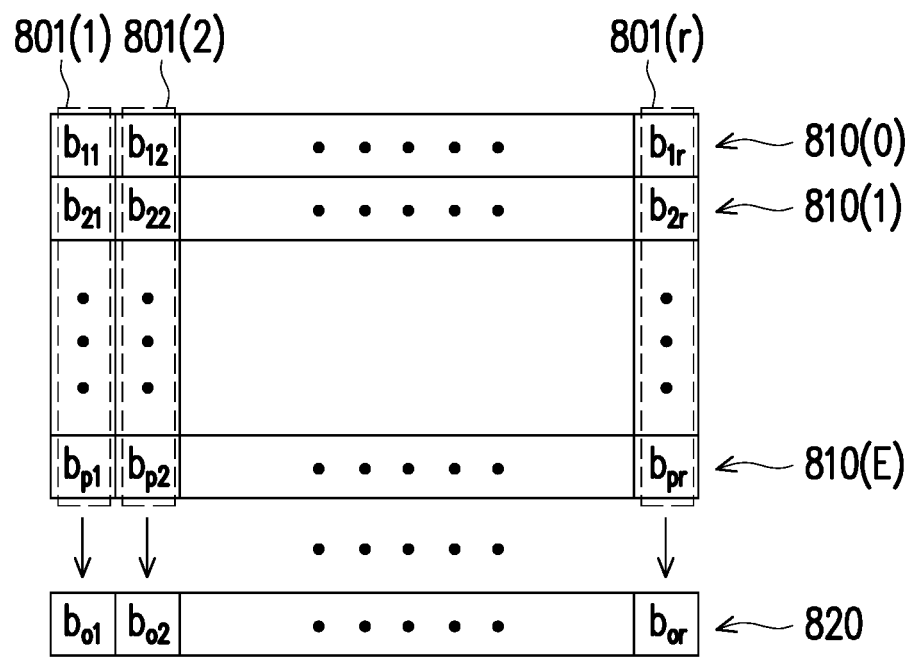
FIG. 12 is a schematic diagram illustrating a multi-frame encoding according to an exemplary embodiment of the invention.

FIG. 12 is a schematic diagram illustrating a multi-frame encoding according to an exemplary embodiment of the invention.

With reference to FIG. 12 that takes encoded data 820 correspondingly generated by encoding the data stored in PPUs 810(0) to 810(E) as an example, in which at least a part of data stored by each of the PPUs 810(0) to 810(E) may be regarded as one frame. In the multi-frame encoding, the data in the PPUs 810(0) to 810(E) are encoded based on each of positions where bits (or bytes) are located. For example, bits $b_{11}, b_{21}, \ldots, b_{p1}$ at a position 801(1) are encoded as a bit $b_{o1}$ in the encoded data 820 and bits $b_{12}, b_{22}, \ldots, b_{p2}$ at a position 801(2) are encoded as a bit $b_{o2}$ in the encoded data 820; and by analogy, bits $b_{1r}, b_{2r}, \ldots, b_{pr}$ at a position 801(r) are encoded as a bit $b_{or}$ in the encoded data 820. Later, the data read from the PPUs 810(0) to 810(E) may be decoded according to the encoded data 820 so attempts on correcting possible errors in the read data can be made.

Herein, in another exemplary embodiment of FIG. 12, the data used for generating the encoded data 820 may also include redundancy bits corresponding to the data bits in the data stored in the PPUs 810(0) to 810(E). Taking the data stored in the PPU 810(0) for example, the redundancy bits therein are, for example, generated by performing the single-frame encoding for the data bits stored in the PPU 810(0). In this exemplary embodiment, it is assumed that when the data of the PPU 810(0) is read, the data read from the PPU 810(0) may be decoded by the redundancy bits (e.g., the encoded data of the single-frame encoding) in the PPU 810(0) so as to perform the error check and correct operation. However, when a decoding operation performed by using the redundancy bits in the PPU 810(0) fails (e.g., a number of error bits of the data stored in the PPU 810(0) is greater than a threshold), a retry-read mechanism may be used to attempt reading correct data from the PPU 810(0). Details regarding the retry-read mechanism would be described later. When the correct data cannot be read from the PPU 810(0) by using the retry-read mechanism, the encoded data 820 and data of the PPUs 810(1) to 810(E) may be read and the decoding may be performed according to the encoded data 820 and the data of the PPUs 810(1) to 810(E) so as to attempt correcting errors included in the data stored in the PPU 810(0). In other words, in this exemplary embodiment, when the decoding operation performed by using the encoded data generated by the single-frame encoding fails and the reading operation performed by using the retry-read mechanism fails, the encoded data generated by the multi-frame encoding will be used for the decoding operation instead.

Figure 13:
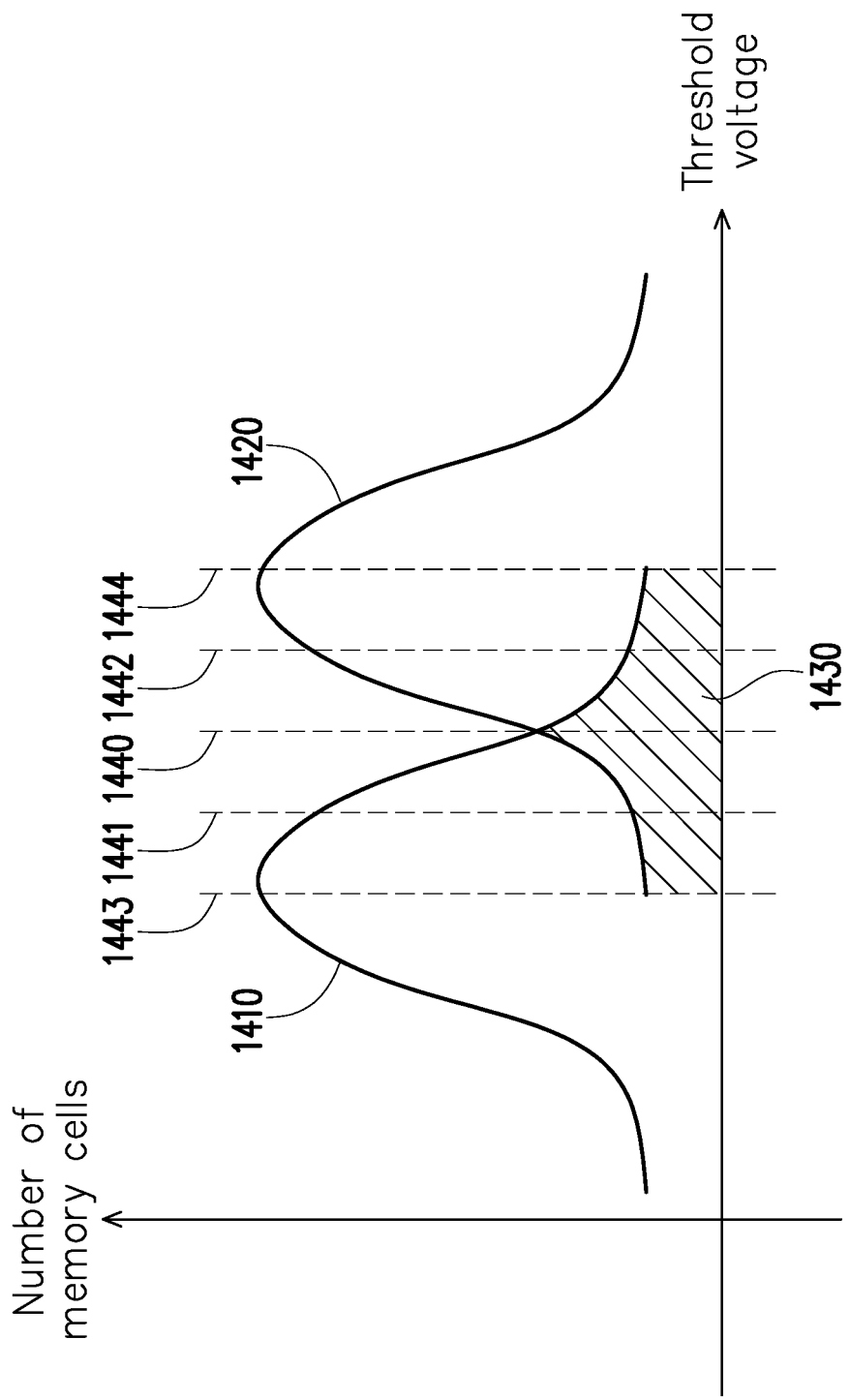
FIG. 13 is a schematic diagram illustrating a retry-read mechanism according to an exemplary embodiment.

In particular, FIG. 13 is a schematic diagram illustrating a retry-read mechanism according to an exemplary embodiment.

With reference to FIG. 13 in which the SLC flash memory is taken as an example, a distribution 1410 and a distribution 1420 are used to indicate the storage states of a plurality of first memory cells, and the distributions 1410 and 1420 respectively indicate different storage states. These first memory cells may belong to the same PPU or different PPUs, and the invention is not limited thereto. Here, it is assumed that when one memory cell belongs to the distribution 1410, and what stored by that memory cell is the bit "1"; and when one memory cell belongs to the distribution 1420, what stored by that memory cell is the bit "0". When the MMC 702 uses a read voltage 1440 to read the memory cell, the MMC 702 would obtain a verification bit, which is used to indicate whether that memory cell is turned on. Here, it is assumed that the verification bit is "1" when the memory cell is turned on, otherwise it is "0", but the invention is not limited thereto. If the verification bit is "1", the MMC 702 determines that this memory cell belongs to distribution 1410, and otherwise, determines that it belongs to the distribution 1420. The distribution 1410 and the distribution 1420 overlap with each other in a region 1430. In other words, there exist several memory cells that should belong to the distribution 1410 but identified as belonging to the distribution 1420 as well as several memory cells that should belong to the distributions 1420 but identified as belonging to the distribution 1410.

In this exemplary embodiment, when reading those memory cells, the MMC 702 would select a preset read voltage (e.g., a read voltage 1441) for reading the memory cells to obtain the verification bits of those memory cells. The error check and correction circuit 708 would perform the decoding operation according to the verification bits of those memory cells so as to generate a plurality of decoded bits. These decoded bits can compose one decoded data (a.k.a. codeword).

If the decoding operation fails, it means that there are uncorrectable error bits stored in these memory cells. If the decoding operation fails, in the retry-read mechanism, the MMC 702 would re-obtain another read voltage, and use said another read voltage (e.g., a read voltage 1442) to read the first memory cells, so as to obtain the verification bits of the memory cells. The MMC 702 performs the same decoding operation according to re-obtained verification bits to obtain another decoded data composed of a plurality of decoded bits. In an exemplary embodiment, the error check and correction circuit 708 would determine whether another decoded data is a valid codeword according to a syndrome corresponding to said another decoded data. If said another decoded data is not the valid codeword, the MMC 702 would determine that the decoding operation fails. If the number of times the read voltage is re-obtained does not exceed a preset number of times, the MMC 702 would re-obtain other read voltages (e.g., a read voltage 1443), and reads the memory cells according to the re-obtained read voltage 1443 to re-obtain the verification bits and perform a first decoding operation.

In other words, when there are uncorrectable error bits, by re-obtaining the read voltage, the verification bits of certain memory cells would be changed so there is an opportunity to change a decoding result of the decoding operation. Logically speaking, the purpose of re-obtaining the read voltage is to flip several bits in one codeword and re-decode the new codeword. In certain cases, the codeword that cannot be decoded before the flipping (with the uncorrectable error bits) may be decoded after the flipping. Also, in an exemplary embodiment, the MMC 702 would attempt the decoding several times until the number of attempts exceeds the preset number of times. Nevertheless, the invention is not intended to limit the preset number of times.

It should be noted that, although the SLC flash memory is used as the example in FIG. 13, the steps of re-obtaining the read voltage are also applicable to the MLC or TLC flash memories. As shown by FIG. 8, changing a read voltage VA would require flipping the LSB of one memory cell, and changing read voltage VB or VC would require flipping the MSB of one memory cell. Therefore, changing the read voltage VA, VB or VC can change one codeword to another codeword. The result of changing the codeword is also applicable to the TLC flash memory of FIG. 9. The invention is not limited to the use of SLC, MLC or TLC flash memory.

It should be noted that, in the conventional retry-read mechanism, normally, the MMC re-obtains another read voltage for the reading operation only when a data record is read but the decoding operation performed according to that data record fails. In other words, before said another read voltage is obtained, it is usually necessary to perform two steps of "reading" and "decoding", and said another read voltage is obtained for the read operation only when the decoding operation fails. However, the more number of times the read voltage is re-obtained, the more time it will consume.

Based on the above, after a data record is read, a decoding method proposed by the invention can quickly determine whether or not the decoding operation on the data record is likely to fail without decoding the data record. In this way, the step of "decoding" of the two steps required before said another read voltage can be obtained in the conventional retry-read mechanism may be skipped to reduce the data reading time and improve the data reading efficiency.

Figure 14:
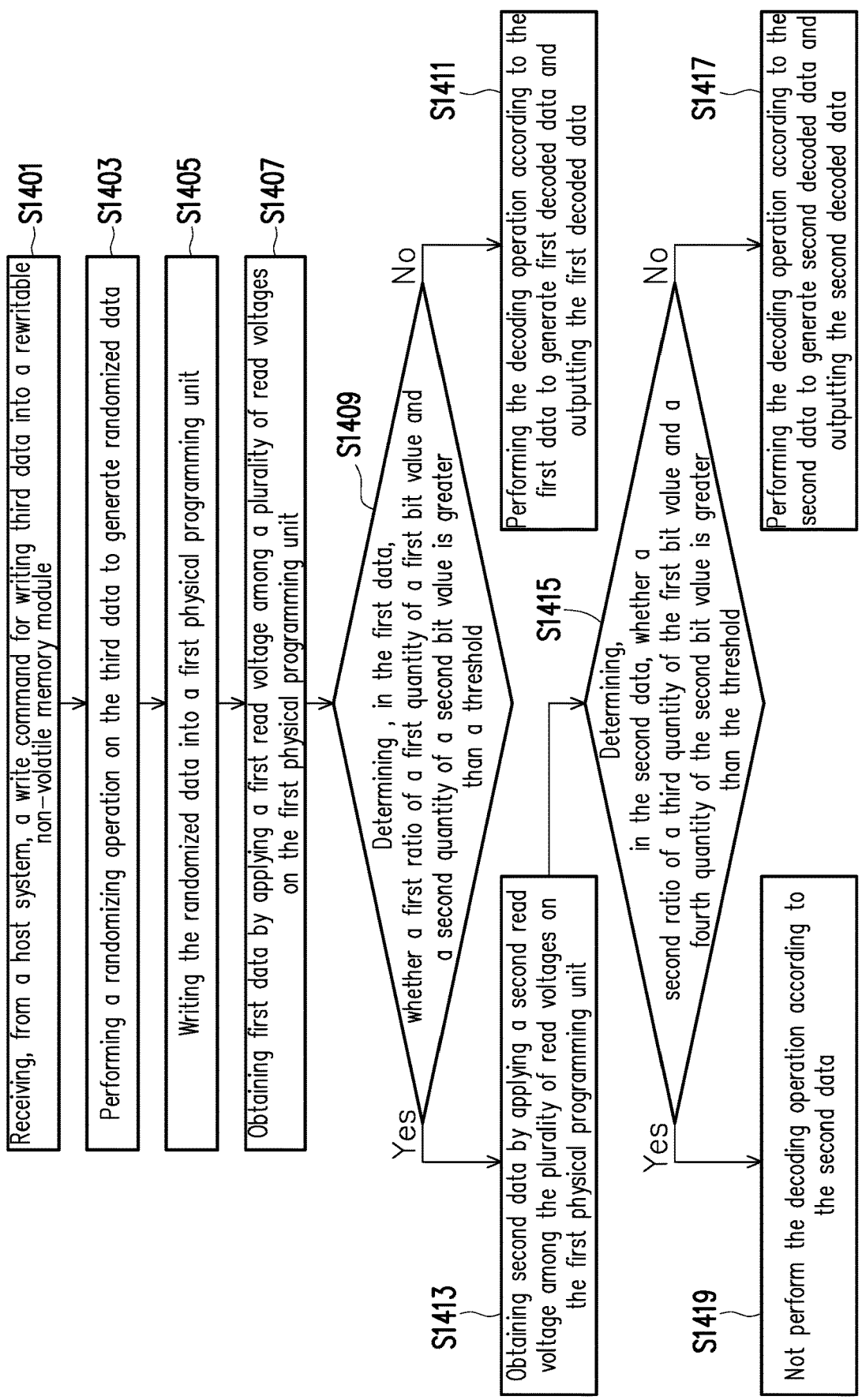
FIG. 14 is a flowchart illustrating a decoding method according to an exemplary embodiment.

FIG. 14 is a flowchart illustrating a decoding method according to an exemplary embodiment.

With reference to FIG. 14, in this embodiment, when the host system 11 intends to write a data record (a.k.a. third data) into the RNVM module 406, the host system 11 can release a write command. Then, the MMC 702 receives, from the host system 11, the write command for writing the third data into the RNVM module 406 (step S1401). According to said write command, the MMC 702 performs a randomizing operation on the third data (e.g., by inputting the third data to a randomizing circuit) to generate randomized data (step S1403), and writes the randomized data into one specific PPU (a.k.a. a first PPU) in the RNVM module 406 (step S1405).

It should be noted that, "the randomizing operation" is used for randomizing (re-processing) data to written into the RNVM module 406. Specifically, to make the data written (programmed) into the RNVM module 406 appear in an irregular disarranged state, the data have to go through the randomizing operation (e.g., editing, calculating or rearranging) before being written, so that the data actually written into the PPUs is properly randomized to avoid data identification errors caused by factors like uneven arrangement, shifting of read voltage or uneven resistance on bit lines. Here, the randomized data generated by performing the randomizing operation on the third data will be different from the third data, and yet a ratio of 0 and 1 in the randomized data may be identical to or different from that of the third data. Similarly, when the reading operation, because the data actually programmed into the PPUs have been randomized, the data read from the RNVM module 406 also have to go through a reverse process in the randomizing operation before original data can be restored.

In this embodiment, a bit quantity (a.k.a. a fifth quantity) of a bit value being 0 (a.k.a. a first bit value) is close to a bit quantity (a.k.a. a sixth quantity) of a bit value being 1 (a.k.a. a second bit value) in the randomized data. For example, in an embodiment, a ratio of the fifth quantity and the sixth quantity is one to one. In this embodiment, the ratio (a.k.a. a third ratio) of the fifth quantity and the sixth quantity is not greater than a threshold. More specifically, said third ratio is a quotient obtained by dividing a difference between the fifth quantity and the sixth quantity by a sum of the fifth quantity and the sixth quantity, and the third data can represent the percentage of the difference between the fifth quantity and the sixth quantity in the randomized data. In this exemplary embodiment, said threshold is 10%. However, the actual value of the threshold is not particularly limited in the invention.

After performing the writing operation on the first PPU, the MMC 702 can perform the reading operation on the first PPU. More specifically, the MMC 702 obtains a data record (a.k.a. first data) by applying a first read voltage (e.g., the read voltage 1441) among the read voltages (e.g., said read voltages 1440 to 1444) on the first PPU (S1407). It should be noted that, the first data may be identical to or different from said third data.

Next, the MMC 702 determines, in the first data, whether a ratio (a.k.a. a first ratio) of a bit quantity (a.k.a. a first quantity) of the bit value being 0 (i.e., the first bit value) and a bit quantity (a.k.a. a second quantity) of the bit value being 1 (i.e., the second bit value) is greater than a threshold (step S1409). Similar to said third ratio, the first ratio is a quotient obtained by dividing a difference between the first quantity and the second quantity by a sum of the first quantity and the second quantity. Here, the sum of the first quantity and the second quantity may also be referred to as a first value. In this exemplary embodiment, the threshold used in step S1409 is 10%, but the actual value of the threshold in step S1409 is not particularly limited by the invention.

If the first ratio is not greater than the threshold, the MMC 702 performs the decoding operation according to the first data to generate decoded data (a.k.a. first decoded data) and outputs the first decoded data (step S1411). It should be noted that, the decoding operation in step S1411 is, for example, a decoding operation using an LDPC algorithm. In addition, before performing the decoding operation, the MMC 702 first performs reverse process in the randomizing operation on the first data, for example.

If the first ratio is greater than the threshold, it means that the first data may fail during the decoding operation. Therefore, the MMC 702 may not perform the decoding operation according to the first data but directly perform the retry-read mechanism for obtaining second data by applying a second read voltage (e.g., the read voltage 1442) among the read voltages (e.g., the read voltages 1440 to 1444) on the first PPU (step S1413). Similarly, the second data may be identical to or different from said third data.

Then, the MMC 702 determines, in the second data, whether a ratio (a.k.a. a second ratio) of a bit quantity (a.k.a. a third quantity) of the bit value being 0 (i.e., the first bit value) and a bit quantity (a.k.a. a fourth quantity) of the bit value being 1 (i.e., the second bit value) is greater than a threshold (step S1415). Similar to said third ratio, the second ratio is a quotient obtained by dividing a difference between the third quantity and the fourth quantity by a sum of the third quantity and the fourth quantity. In this exemplary embodiment, the threshold used in step S1415 is 10%, but the actual value of the threshold in step S1415 is not particularly limited by the invention.

When the second ratio is not greater than the threshold, the MMC 702 performs the decoding operation according to the second data to generate decoded data (a.k.a. second decoded data) and outputs the second decoded data (step S1417). It should be noted that, the decoding operation in step S1417 is, for example, the decoding operation using the LDPC algorithm. In addition, before performing the decoding operation, the MMC 702 first performs reverse process in the randomizing operation on the second data, for example.

When the second ratio is greater than the threshold, it means that the second data may fail during the decoding operation. Therefore, the MMC 702 may not perform the decoding operation according to the second data (step S1419). If a number of times the read voltage being re-obtained has not yet reached to a preset value at the time, the MMC 702 can perform the retry-read mechanism again for reading the first PPU to obtain data by using one specific read voltage (e.g., the read voltage 1444) among the read voltages (e.g., the read voltages 1440 to 1444) and perform the determination in step S1409 (or step S1415). However, if the number of times the read voltage being re-obtained has reached the preset value, the MMC 702 then uses, for example, the encoded data generated by the multi-frame encoding instead.

In summary, after a data record is read, the decoding method, the memory control circuit unit and the memory storage device of the invention can quickly determine whether or not the decoding operation on the data record is likely to fail without decoding the data record. Also, if the decoding operation may fail, another read voltage may be re-obtained directly for the reading operation. In this way, the execution time for the retry-read mechanism may be reduced and the data reading efficiency may be improved accordingly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a rewritable non-volatile memory module, the rewritable non-volatile memory module having a plurality of physical erasing units, each physical erasing unit among the plurality of physical erasing units having a plurality of physical programming units, the decoding method comprising:
    obtaining first data by applying a first read voltage among a plurality of read voltages on a first physical programming unit of a first physical erasing unit among the plurality of physical erasing units;
    determining, in the first data, whether a first ratio of a first quantity of a first bit value and a second quantity of a second bit value is greater than a threshold;
    performing a decoding operation according to the first data to generate first decoded data and outputting the first decoded data if the first ratio is not greater than the threshold; and
    not performing the decoding operation according to the first data if the first ratio is greater than the threshold,
    wherein the step of determining whether the first ratio of the first quantity of the first bit value and the second quantity of the second bit value in the first data is greater than the threshold comprises:
    obtaining a difference between of the first quantity and the second quantity;
    determining that the first ratio is not greater than the threshold if a quotient obtained by dividing the difference by a first value is not greater than the threshold; and
    determining that the first ratio is greater than the threshold if the quotient obtained by dividing the difference by the first value is greater than the threshold,
    wherein the first value is a sum of the first quantity and the second quantity.

2. The decoding method according to claim 1, wherein the threshold is 10%.

3. The decoding method according to claim 1, wherein if the first ratio is greater than the threshold, the method further comprises:
    obtaining second data by applying a second read voltage among the plurality of read voltages on the first physical programming unit;
    determining, in the second data, whether a second ratio of a third quantity of the first bit value and a fourth quantity of the second bit value is greater than the threshold;
    performing the decoding operation according to the second data to generate second decoded data and outputting the second decoded data if the second ratio is not greater than the threshold; and
    not performing the decoding operation according to the second data if the second ratio is greater than the threshold.

4. The decoding method according to claim 1, wherein before obtaining the first data by applying the first read voltage among the plurality of read voltages on the first physical programming unit of the first physical erasing unit among the plurality of physical erasing units, the method further comprises:
    receiving, from a host system, a write command for writing third data into the rewritable non-volatile memory module;
    performing a randomizing operation on the third data according to the write command to generate randomized data, wherein a third ratio of a fifth quantity of the first bit value and a sixth quantity of the second bit value in the randomized data is not greater than the threshold; and
    writing the randomized data into the first physical programming unit.

5. A decoding method for a rewritable non-volatile memory module, the rewritable non-volatile memory module having a plurality of physical erasing units, each physical erasing unit among the plurality of physical erasing units having a plurality of physical programming units, the decoding method comprising:
    obtaining first data by applying a first read voltage among a plurality of read voltages on a first physical programming unit of a first physical erasing unit among the plurality of physical erasing units;
    determining, in the first data, whether a first ratio of a first quantity of a first bit value and a second quantity of a second bit value is greater than a threshold;
    performing a decoding operation according to the first data to generate first decoded data and outputting the first decoded data if the first ratio is not greater than the threshold;
    obtaining second data by applying a second read voltage among the plurality of read voltages on the first physical programming unit if the first ratio is greater than the threshold;
    determining, in the second data, whether a second ratio of a third quantity of the first bit value and a fourth quantity of the second bit value is greater than the threshold;
    performing the decoding operation according to the second data to generate second decoded data and outputting the second decoded data if the second ratio is not greater than the threshold; and
    not performing the decoding operation according to the second data if the second ratio is greater than the threshold,
    wherein the step of determining whether the first ratio of the first quantity of the first bit value and the second quantity of the second bit value in the first data is greater than the threshold comprises:
    obtaining a difference between of the first quantity and the second quantity;
    determining that the first ratio is not greater than the threshold if a quotient obtained by dividing the difference by a first value is not greater than the threshold; and
    determining that the first ratio is greater than the threshold if the quotient obtained by dividing the difference by the first value is greater than the threshold,
    wherein the first value is a sum of the first quantity and the second quantity.

6. A memory controlling circuit unit for a rewritable non-volatile memory module, the rewritable non-volatile memory module having a plurality of physical erasing units, each physical erasing unit among the plurality of physical erasing units having a plurality of physical programming units, the memory controlling circuit unit comprising:
    a host interface, configured to couple to a host system,
    a memory interface, configured to couple to a rewritable non-volatile memory module;
    a memory management circuit, coupled to the host interface and the memory interface,
    wherein the memory management circuit is configured to obtain first data by applying a first read voltage among a plurality of read voltages on a first physical programming unit of a first physical erasing unit among the plurality of physical erasing units, wherein the memory management circuit is further configured to determine, in the first data, whether a first ratio of a first quantity of a first bit value and a second quantity of a second bit value is greater than a threshold, wherein the memory management circuit is further configured to perform a decoding operation according to the first data to generate first decoded data and output the first decoded data if the first ratio is not greater than the threshold, wherein the memory management circuit does not perform the decoding operation according to the first data if the first ratio is greater than the threshold, wherein in the operation of determining whether the first ratio of the first quantity of the first bit value and the second quantity of the second bit value in the first data is greater than the threshold, the memory management circuit is further configured to obtain a difference between the first quantity and the second quantity, the memory management circuit is further configured to determine that the first ratio is not greater than the threshold if a quotient obtained by dividing the difference by a first value is not greater than the threshold, and the memory management circuit is further configured to determine that the first ratio is greater than the threshold if the quotient obtained by dividing the difference by the first value is greater than the threshold, wherein the first value is a sum of the first quantity and the second quantity.

7. The memory controlling circuit unit according to claim 6, wherein the threshold is 10%.

8. The memory controlling circuit unit according to claim 6, wherein if the first ratio is greater than the threshold, the memory management circuit is further configured to obtain second data by applying a second read voltage among the plurality of read voltages on the first physical programming unit, the memory management circuit is further configured to determine, in the second data, whether a second ratio of a third quantity of the first bit value and a fourth quantity of the second bit value in the second data is greater than the threshold, the memory management circuit is further configured to perform the decoding operation according to the second data to generate second decoded data and output the second decoded data if the second ratio is not greater than the threshold, and the memory management circuit does not perform the decoding operation according to the second data if the second ratio is greater than the threshold.

9. The memory controlling circuit unit according to claim 6, wherein before the operation of obtaining the first data by applying the first read voltage among the plurality of read voltages on the first physical programming unit of the first physical erasing unit among the plurality of physical erasing units, the memory management circuit is further configured to receive, from the host system, a write command for writing third data into the rewritable non-volatile memory module, the memory management circuit is further configured to perform a randomizing operation on the third data according to the write command to generate randomized data, wherein a third ratio of a fifth quantity of the first bit value and a sixth quantity of the second bit value in the randomized data is not greater than the threshold, and the memory management circuit is further configured to write the randomized data into the first physical programming unit.

10. A memory storage device, comprising:

a connection interface unit configured to couple to a host system;

a rewritable non-volatile memory module, having a plurality of physical erasing units, each physical erasing unit among the plurality of physical erasing units having a plurality of physical programming units; and a memory controlling circuit unit, coupled to the connection interface unit and the rewritable non-volatile memory module, wherein the memory controlling circuit unit is configured to obtain first data by applying a first read voltage among a plurality of read voltages on a first physical erasing unit among the plurality of physical erasing units, wherein the memory controlling circuit unit is further configured to determine, in the first data, whether a first ratio of a first quantity of a first bit value and a second quantity of a second bit value is greater than a threshold, wherein the memory controlling circuit unit is further configured to perform a decoding operation according to the first data to generate first decoded data and output the first decoded data if the first ratio is not greater than the threshold, wherein the memory controlling circuit unit does not perform the decoding operation according to the first data if the first ratio is greater than the threshold, wherein in the operation of determining whether the first ratio of the first quantity of the first bit value and the second quantity of the second bit value in the first data is greater than the threshold, the memory controlling circuit unit is further configured to obtain a difference between the first quantity and the second quantity, the memory controlling circuit unit is further configured to determine that the first ratio is not greater than the threshold if a quotient obtained by dividing the difference by a first value is not greater than the threshold, and the memory controlling circuit unit is further configured to determine that the first ratio is greater than the threshold if the quotient obtained by dividing the difference by the first value is greater than the threshold, wherein the first value is a sum of the first quantity and the second quantity.

11. The memory storage device according to claim 10, wherein the threshold is 10%.

12. The memory storage device according to claim 10, wherein if the first ratio is greater than the threshold, the memory controlling circuit unit is further configured to obtain second data by applying a second read voltage among the plurality of read voltages on the first physical programming unit, the memory controlling circuit unit is further configured to determine, in the second data, whether a second ratio of a third quantity of the first bit value and a fourth quantity of the second bit value in the second data is greater than the threshold, the memory controlling circuit unit is further configured to perform the decoding operation according to the second data to generate second decoded data and output the second decoded data if the second ratio is not greater than the threshold, and the memory controlling circuit unit does not perform the decoding operation according to the second data if the second ratio is greater than the threshold.

13. The memory storage device according to claim 10, wherein before the operation of obtaining the first data by applying the first read voltage among the plurality of read voltages on the first physical programming unit of the first physical erasing unit among the plurality of physical erasing units, the memory controlling circuit unit is further configured to receive, from the host system, a write command for writing third data the rewritable non-volatile memory module, the memory controlling circuit unit is further configured to perform a randomizing operation on the third data according to the write command to generate randomized data, wherein a third ratio of a fifth quantity of the first bit value and a sixth quantity of the second bit value in the randomized data is not greater than the threshold, and the memory controlling circuit unit is further configured to write the randomized data into the first physical programming unit.

* * * * *